(12) United States Patent
Li et al.

(10) Patent No.: US 6,858,862 B2
(45) Date of Patent: Feb. 22, 2005

(54) DISCRETE POLYMER MEMORY ARRAY AND METHOD OF MAKING SAME

(75) Inventors: Jian Li, Sunnyvale, CA (US); Xiao-Chun Mu, Saratoga, CA (US)

(73) Assignee: Intel Corporation, Santa Clara, CA (US)

( * ) Notice: Subject to any disclaimer, the term of this patent is extended or adjusted under 35 U.S.C. 154(b) by 188 days.

(21) Appl. No.: 09/896,656

(22) Filed: Jun. 29, 2001

(65) Prior Publication Data

US 2003/0001151 A1 Jan. 2, 2003

(51) Int. Cl.$^7$ .............................................. H01L 29/06
(52) U.S. Cl. ..................... 257/10; 257/295; 257/314; 438/3; 438/99; 438/407
(58) Field of Search ...................... 257/10, 295, 314; 438/3, 99, 407

(56) References Cited

U.S. PATENT DOCUMENTS

| | | | |
|---|---|---|---|
| 3,623,038 A | * 11/1971 | Franklin et al. | ............ 365/173 |
| 4,538,884 A | 9/1985 | Masaki | |
| 4,593,456 A | 6/1986 | Cheung | |
| 4,873,455 A | 10/1989 | De Chambost et al. | |
| 4,995,705 A | 2/1991 | Yoshinaga et al. | |
| 5,248,564 A | 9/1993 | Ramesh | |

(List continued on next page.)

FOREIGN PATENT DOCUMENTS

JP      363 293 729 A    11/1988

OTHER PUBLICATIONS

Borca, C., et al., "Influence of dynamical scattering in crystalline poly (vinylidene fluoride–trifluoroethylene) copolymers", *Applied Physics Letters*, vol. 74, 347–349, (Jan. 18, 1999).

Borca, C., et al., "Lattice–Stiffening Transition in Copolymer Films of Vinylidene Fluoride (70%) with Trifluoroethylene (30%)", *Physical Review Letters*, 4562–4565, (Nov. 29, 1999).

Bune, A., et al., "Piezoelectric and pyroelectric properties of ferroelectric Langmuir–Blodgett polymer films", *Journal of Applied Physics*, vol. 85; 7869–7873, (Jun. 1, 1999).

Brune, A., et al., "Two–dimensional ferroelectric films", *NATURE*, vol. 391, 874–877, (Feb. 26, 1998).

Choi, J., et al., "Phase transition in the surface structure in copolymer films of vinylidene fluoride (70%) with trifluoroethylene (30%)", *Physical Review B*, vol. 61, 5760–5770, (Feb. 15, 2000).

Desu, S., "Minimization of Fatigue in Ferroelectric Films", *Phys. Stat. Sol. (a)* 151, 467–480, (1995).

Ducharme, S., et al., "Ultrathin Ferroelectric Polymer Films", *Ferroelectrics*, vol. 202, 29–37, (1997).

Lovinger, A.J., "Ferroelectric Polymers", *Science*, vol. 220, 1115–1121, (Jun. 10, 1983).

(List continued on next page.)

*Primary Examiner*—David Nelms
*Assistant Examiner*—Dao H. Nguyen
(74) *Attorney, Agent, or Firm*—Anthony M. Martinez

(57) ABSTRACT

The invention relates to discrete, spaced-apart ferroelectric polymer memory device embodiments. The ferroelectric polymer memory device is fabricated by spin-on polymer processing and etching using photolithographic technology. The size of the discrete, spaced-apart ferroelectric polymer structures may be tied to a specific photolithography minimum feature dimension.

The invention also relates to a process for making embodiments of a polymer memory device that includes discrete, spaced-apart ferroelectric polymer structures. The discrete, spaced-apart ferroelectric polymer structures may have a minimum feature that is tied to the current photolithography that may reduce the voltage and increase the switching speed.

29 Claims, 9 Drawing Sheets

U.S. PATENT DOCUMENTS

| | | | |
|---|---|---|---|
| 5,438,023 | A | 8/1995 | Argos et al. |
| 5,499,206 | A | 3/1996 | Muto |
| 5,519,566 | A | 5/1996 | Perino et al. |
| 5,578,867 | A | 11/1996 | Argos et al. |
| 5,592,643 | A | 1/1997 | Thomas |
| 5,777,356 | A | 7/1998 | Dhote et al. |
| 5,838,035 | A | 11/1998 | Ramesh |
| 5,843,808 | A | 12/1998 | Karnezos |
| 5,864,932 | A | 2/1999 | Evans et al. |
| 5,927,206 | A * | 7/1999 | Bacon et al. ............... 101/453 |
| 5,939,775 | A | 8/1999 | Bucci et al. |
| 6,054,331 | A | 4/2000 | Woo et al. |
| 6,072,716 | A | 6/2000 | Jacobson et al. |
| 6,072,718 | A * | 6/2000 | Abraham et al. ........... 365/173 |
| 6,115,281 | A | 9/2000 | Aggarwal et al. |
| 6,141,309 | A | 10/2000 | Saitou et al. |
| 6,171,934 | B1 | 1/2001 | Joshi et al. |
| 6,194,229 | B1 | 2/2001 | Basceri |
| 6,210,979 | B1 | 4/2001 | Kweon et al. |
| 6,265,230 | B1 | 7/2001 | Aggarwal et al. |
| 6,269,018 | B1 * | 7/2001 | Monsma et al. ............ 365/145 |
| 6,314,641 | B1 | 11/2001 | Akram |
| 6,323,512 | B1 | 11/2001 | Noh et al. |
| 6,324,069 | B1 | 11/2001 | Weber |
| 6,337,032 | B1 | 1/2002 | Chivukula et al. |
| 6,376,259 | B1 | 4/2002 | Chu et al. |
| 6,420,190 | B1 | 7/2002 | Shimoda et al. |
| 2002/0000005 | A1 | 1/2002 | Jennier |
| 2002/0024835 | A1 | 2/2002 | Thomson et al. |
| 2002/0044480 | A1 | 4/2002 | Gudesen et al. |
| 2002/0093845 | A1 * | 7/2002 | Matsuoka et al. ............ 365/97 |

OTHER PUBLICATIONS

Morikawa, E., et al., "Photoemission study of direct photo-micromachining in poly(vinylidene fluoride)", *Journal of Applied Physics*, vol. 87, 4010–4016, (Apr. 15, 2000).

IBM Technical Disclosure Bulletin, vol. 37 (11), pp. 421–424, 1994.

* cited by examiner

DISCRETE POLYMER MEMORY ARRAY AND METHOD OF MAKING SAME

BACKGROUND OF THE INVENTION

1. Field of the Invention

The present invention relates to fabrication of a microelectronic storage device. More particularly, the present invention relates to a cross-point ferroelectric polymer memory device. In particular, the present invention relates to improved voltage and switching speed for a ferroelectric polymer memory structure.

2. Description of Related Art

In the microelectronics field, continual pressure exists to find faster, denser, and more cost-effective solutions to data storage. One particular area of interest is lower voltage applications for various reasons, particularly for mobile platforms. Whether the data storage is fast, on-die storage such as static random access memory (SRAM), whether it is the somewhat slower embedded dynamic random access memory (eDRAM), the even slower off-die dynamic random access memory (DRAM), or whether it is magnetic- or magneto optical disks for mass storage, each technology is constantly being advanced to meet the demand for increased speed and capacity, and for lower voltage operation.

It was discovered that some polymers exhibit ferromagnetism. One such polymer is poly vinylidene fluoride (PVDF, whose repeat formula is $(CH_2-CF_2)_n$) and some of its copolymers. One activity involved in operation of a ferroelectric polymer data storage device relates to a lower voltage read and write capability as well as a faster switching speed.

BRIEF DESCRIPTION OF THE DRAWINGS

In order that the manner in which the above recited and other advantages of the invention are obtained, a more particular description of the invention briefly described above will be rendered by reference to specific embodiments thereof which are illustrated in the appended drawings. Understanding that these drawings depict only typical embodiments of the invention that are not necessarily drawn to scale and are not therefore to be considered to be limiting of its scope, the invention will be described and explained with additional specificity and detail through the use of the accompanying drawings in which.

DETAILED DESCRIPTION OF THE INVENTION

Figure 1:
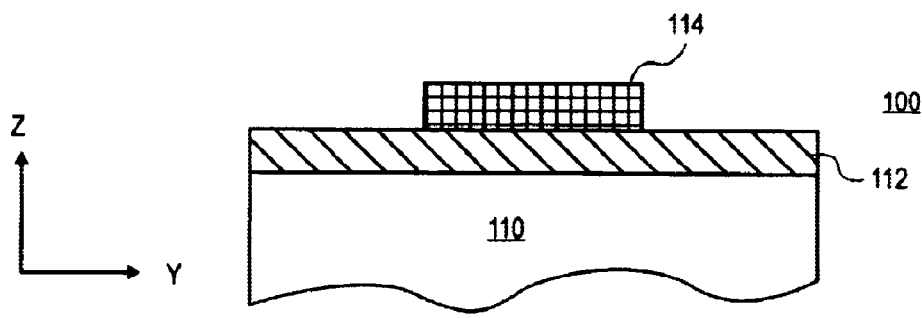
FIG. 1 is an elevational cross-section view of a semiconductor structure that illustrates one stage of fabrication of an embodiment of the present invention.

The present invention relates to a ferroelectric polymer storage device including a ferroelectric polymer structure that is sandwiched between an array of electrodes that achieve electrical signaling across the ferroelectric polymer structure. With the knowledge of the ferromagnetic qualities of such polymers, the inventors ventured to take advantage of the ability to orient ferromagnetic polymer layers as a data storage device.

In some applications, the ferroelectric polymer structure may preferably be patterned. Because of lower power incentives, the inventors looked to reducing the voltage that is required to perform reads and writes to the ferroelectric polymer (FEP) structure.

The switching voltage and switching speed of an FEP structure may depend on the thickness of the FEP structure, the local polymer chain length, as well as the micro-local morphology of the structure. Ferroelectric behavior in a polymer material is attributed to transverse dipole moments in the molecule. For example, a fluorine-based polymer may have a transverse dipole moment formed by positive hydrogen and negative fluorine atoms that are in the trans configuration.

Ferroelectric properties are discoverable below the temperature of the ferroelectric phase transition, which is the working temperature upper limit. Below this temperature, the main chain of a ferroelectric polymer may be arranged in the substantially all-trans configuration such that dipole moments are parallel, at least, within ferroelectric domains that are separated from each other by domain walls. Ferroelectric polymers form chain lengths that may be in the range of about one micro meter (micron). Accordingly, when the dipole moment is reversed from one state to the opposite, the entire chain is affected. Therefore, a longer chain will require a greater power input in order to get the entire chain to reverse its dipole. In any event, the longer the polymer chain, the more resistant it will be to a significant dipole reversal. Consequently, a longer polymer chain may cost a greater amount of power and dipole-switching time.

The following description includes terms, such as upper, lower, first, second, etc. that are used for descriptive purposes only and are not to be construed as limiting. The embodiments of an apparatus or article of the present invention described herein can be manufactured, used, or shipped in a number of positions and orientations.

Reference will now be made to the drawings wherein like structures will be provided with like reference designations. In order to show the structures of the present invention most clearly, the drawings included herein are diagrammatic representations of integrated circuit structures. Thus, the actual appearance of the fabricated structures, for example in a photomicrograph, may appear different while still incorporating the essential structures of the present invention. Moreover, the drawings show only the structures necessary to understand the present invention. Additional structures known in the art have not been included to maintain the clarity of the drawings.

Figure 2:
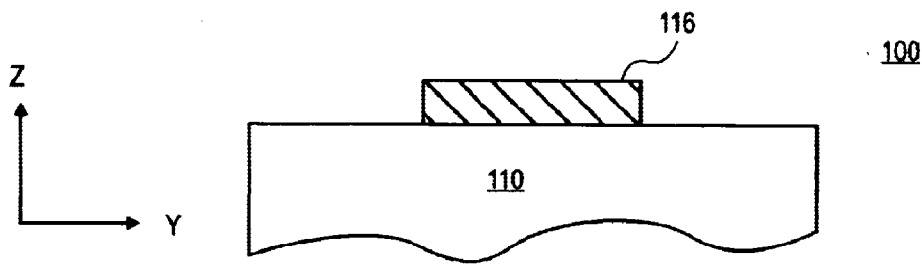
FIG. 2 is an elevational cross-section view of the semiconductor structure depicted in FIG. 1 after further processing.

Accordingly, one embodiment relates to the patterning of an FEP layer into discrete, spaced apart FEP structures. The ferroelectric polymer storage device may be referred to as a cross-point matrix polymer memory structure. FIG. 1 illustrates a process flow embodiment in which a polymer memory device 100 is being fabricated. A substrate 110 is depicted with a conductive layer 112 and a patterned mask 114. Substrate 110 may be an interlayer dielectric (ILD) material such as silicon oxide substrate or a silicon substrate, respectively. Substrate 110 may also be an ILD such as a polyimide material as is known in the art. Mask 114 is provided for patterning conductive layer 112 into a first or lower electrode 116 as depicted in FIG. 2 and first mask 114 may be a spin-on resist as is known in the art. First electrode 116 may be formed by physical vapor deposition (PVD) or chemical vapor deposition (CVD) of any material that is suitable as an electrical conductor according to electrical conductors known in the art. In one embodiment, first electrode 116 is an aluminum material. The thickness and width of first electrode 116 may depend upon the specific lithography and design rules. Under certain thermal budgets or other applications, first electrode 116 may be formed by CVD.

Etching to form first electrode 116 may be carried out under conditions such as with an anisotropic etch recipe that is selective to first mask 114 and to substrate 110. Depending upon the materials, the lithography, and the design rules, various etch recipes may be selected.

Figure 3:
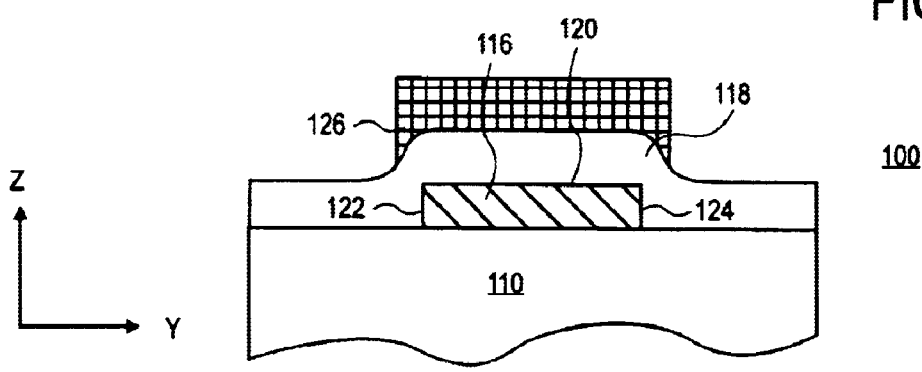
FIG. 3 is an elevational cross-section view of the semiconductor structure depicted in FIG. 2 after further processing.

FIG. 3 illustrates further processing as viewed in elevational cross section. FIG. 3 depicts a rectilinear cross section of first electrode 116 with four surfaces. An FEP layer 118 is formed over first electrode 116 in a manner that contacts first electrode 116 upon three of four surfaces; an upper surface 120, a first vertical surface 122, and a second vertical surface 124. The fourth surface rests upon substrate 110. FIG. 3 also illustrates that a second mask 126 has been patterned over FEP layer 118 in preparation for further processing.

Figure 4:
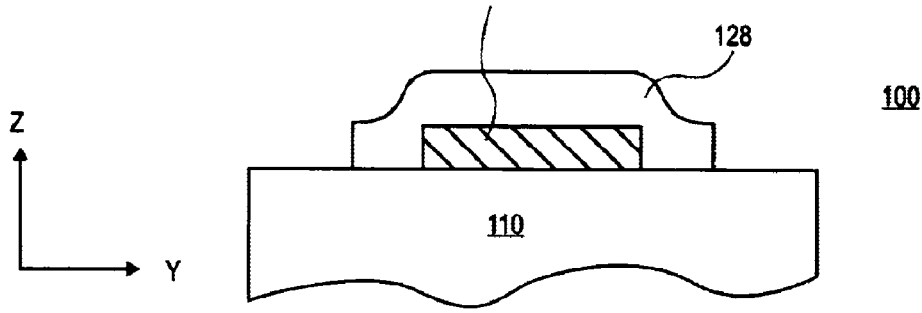
FIG. 4 is an elevational cross-section view of the semiconductor structure depicted in FIG. 3 after further processing.
Figure 5:
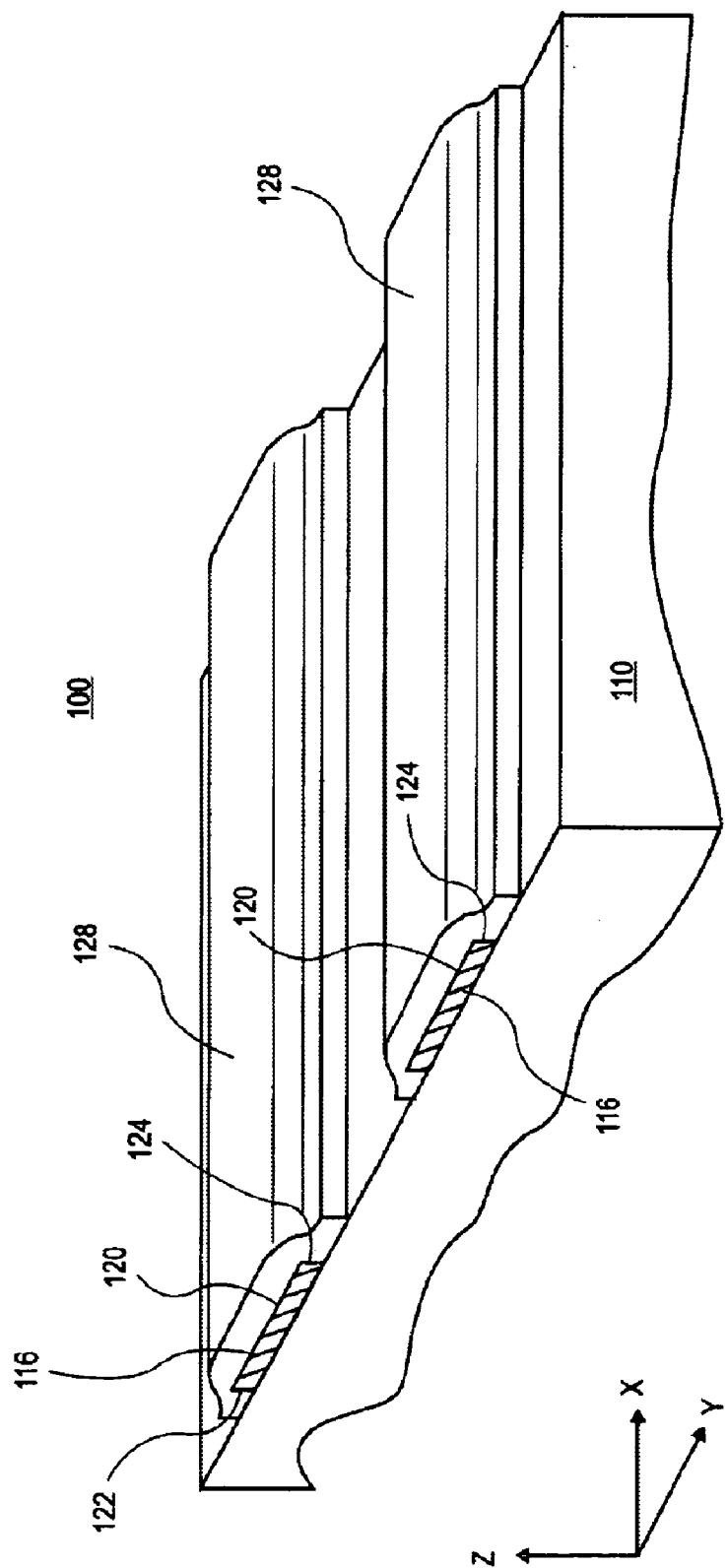
FIG. 5 is an elevational oblique view of the semiconductor structure depicted in FIG. 4.

FIG. 4 illustrates the effect of patterning of FEP layer 118 depicted in FIG. 3. Thereby, a segmented, elongated FEP structure 128 is formed out of the FEP layer 118 (FIG. 3). Further, first electrode 116 is contacted by segmented, elongated FEP structure 128 on three of four surfaces when viewed in the manner illustrated in FIG. 4. FIG. 5 is an elevational oblique view of memory device 100 during further processing that illustrates segmented, elongated FEP structures 128 in an array of first electrodes 116. First electrode 116 is protected from possible shorting by the overlap of FEP structure 128 onto substrate 110 that covers upper surface 120, first vertical surface 122, and second vertical surface 124.

Figure 6:
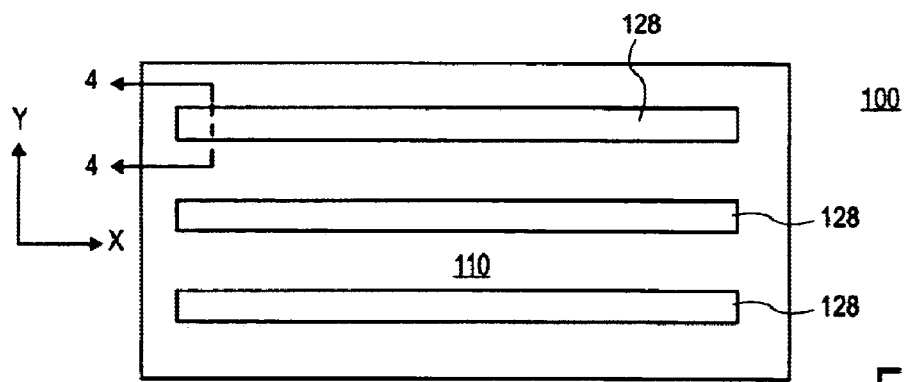
FIG. 6 is a top schematic plan view of the semiconductor structure depicted in FIGS. 4 and 5.

FIG. 6 is a top plan schematic view of memory device 100 during fabrication that also illustrates segmented, elongated FEP structures 128 as they cover first electrodes 116 (not visible) that are disposed upon substrate 110. FIG. 4 is viewable along the section line 4—4 as illustrated in FIG. 6. The formation of segmented, elongated FEP structures 128 may be carried out in an oxygen plasma process that attenuates exposed portions of FEP layer 118 as illustrated in FIG. 3. Oxygen plasma processing is known in the art and may be carried out at ambient temperature and pressure.

Figure 7:
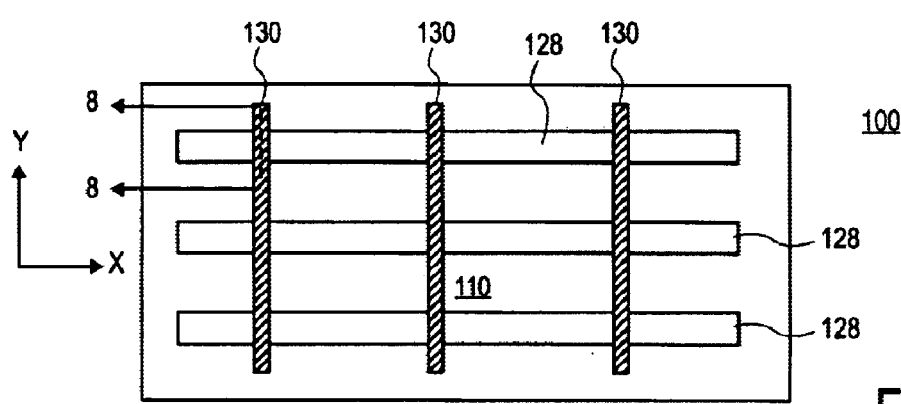
FIG. 7 is a top schematic plan view of the semiconductor structure depicted in FIG. 6 after further processing.

FIG. 7 is also a top plan schematic view of memory device 100 after further processing of memory device 116 as depicted in FIG. 6. A second or upper electrode 130 is illustrated as being patterned in what may be referred to as a cross-point configuration with first electrode 116 (not visible). Second electrode 130 may also be an electrically conductive material like first electrode 116. The formation of second electrode 130 may be carried out by a PVD process that is sensitive to preserving the physical qualities of the FEP structure. Patterning of second electrode 130 may be carried out by etching as is known in the art. It is noted that the etch recipe may be selective to segmented, elongated FEP structure 128 as well as to substrate 110. Etch conditions required to form second electrode 130 may be the same as etch conditions required to form first electrode 116.

Figure 8:
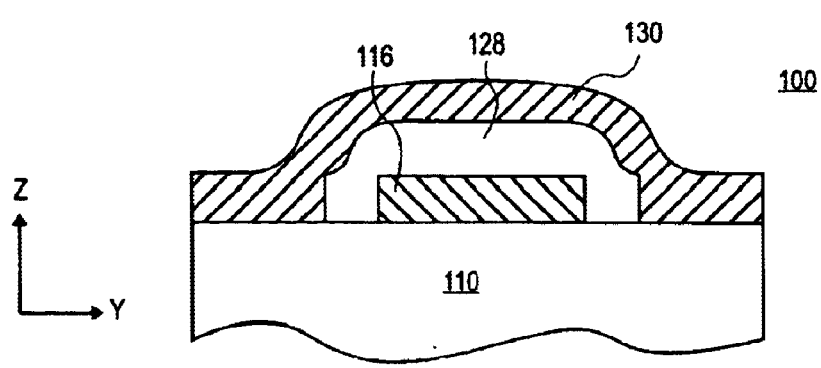
FIG. 8 presents an elevational cross-section view of the semiconductor structure depicted in FIG. 7 after further processing.

FIG. 8 is an elevational cross-section view of memory device 100 depicted in FIG. 7 as taken along the section line 8—8 after further processing. Second electrode 130 is disposed above and on substrate 110. Segmented, elongated FEP structure 128 is both abutting and above and on first electrode 116. Similarly, second electrode 130 is both abutting and above and on segmented, elongated FEP structure 128. FIG. 8 illustrates the use of segmented, elongated FEP structure 128 as an insulator to prevent shorting of first electrode 116 and second electrode 130.

Figure 9:
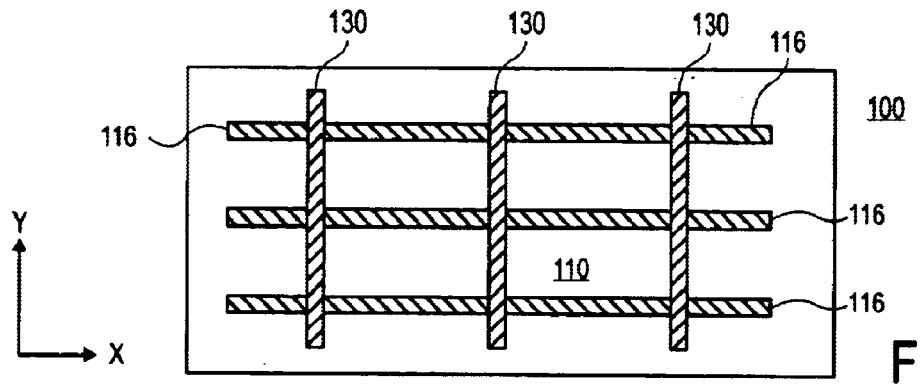
FIG. 9 is a top schematic plan view of the semiconductor structure depicted in FIG. 7 after further processing.

FIG. 9 illustrates memory device 100 after further processing. A second etch has been carried out to further remove FEP material that is laterally exposed between the array of electrodes 116 and 130. Accordingly, the FEP structure that is depicted as segmented, elongate FEP structure 128 in FIG. 8 has been further patterned with the use of second electrode 130 as a mask. As before, further removal of exposed FEP material may be carried out in an ambient oxygen plasma etch as is known in the art.

Figure 10:
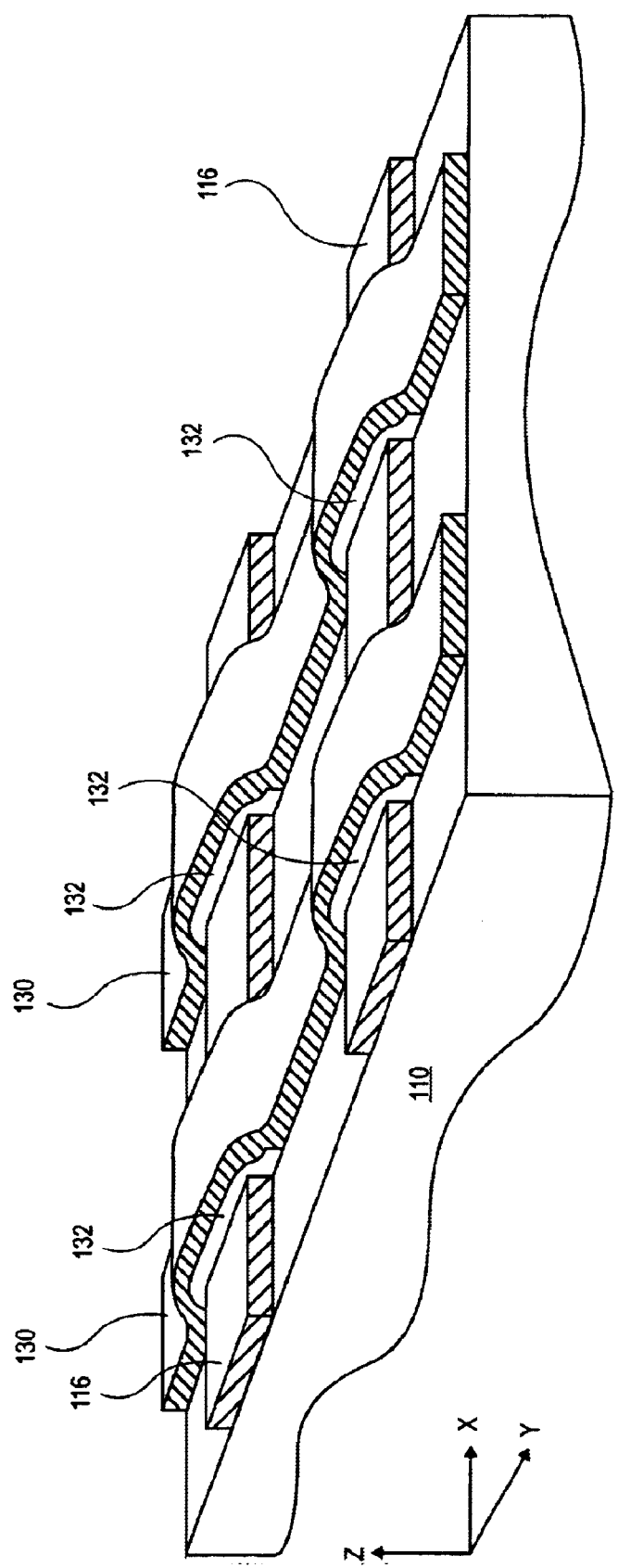
FIG. 10 is an elevational oblique view of the semiconductor structure depicted in FIG. 9.

The achievement of discrete, spaced-apart FEP structures 132 is further illustrated in FIG. 10. FIG. 10 is an elevational oblique view of memory device 100 after processing as illustrated in FIG. 9. It can be seen that discrete, spaced-apart FEP structures 132 have been self-aligned beneath second electrodes 130 after etch processing such as the oxygen plasma etch. Substrate 110 is depicted as being a support surface that makes contact with first electrode 116, discrete, spaced-apart FEP structures 132, and second electrode 130.

Figure 11:
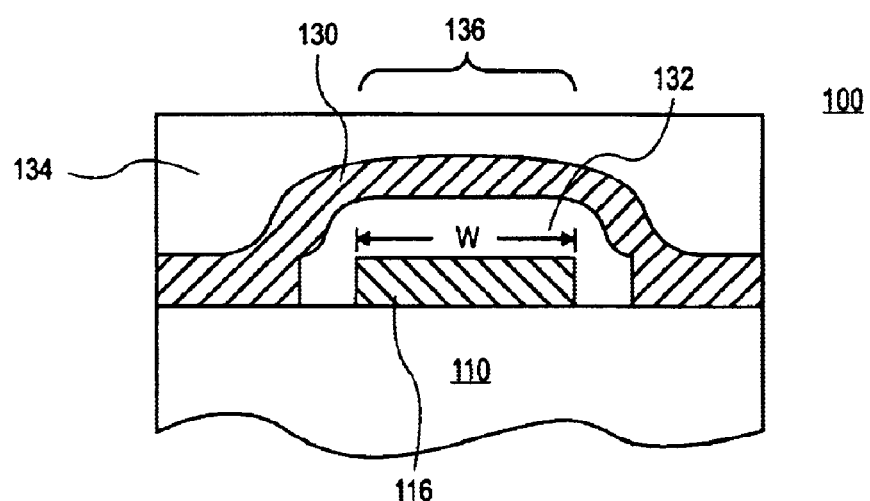
FIG. 11 presents an elevational cross-section view of the semiconductor structure depicted in FIG. 8 after further processing.

After the formation of discrete, spaced-apart FEP structures 132, further processing may be carried out by forming a protective film 134 over the electrodes as depicted in FIG. 11. Blanket formation of protective film 134 may be done such as by spin-on processing of a polyimide material as is known in the art. In another embodiment, an inorganic material may be deposited, subject only to avoiding temperature elevation that will compromise the quality of discrete, spaced-apart FEP structures 132. For example atomic layer CVD (ALCVD) may be carried out according to known technique.

FIG. 11 also illustrates the achievement of a configuration that may be referred to as a "cross point" 136. In other words, the cross point 136 or projection of the width W, of first electrode 116 upward onto second electrode 130 exposes an area of discrete, spaced-apart FEP structure 132 that is about equivalent to the square of width W if second electrode 130 also has a width of about width W. The amount of discrete, spaced-apart FEP structure 132 that is within this projected area may be most susceptible of being written to and read from as a memory element embodiment. The cross point 136 of polymer memory device 100 may have a dimension in the X-direction that may be tied to a particular minimum-feature mask technology. For example, photolithography process flows may have minimum features that are 0.25 micrometers (microns), 0.18 microns, 0.13 microns, and 0.11 microns. It is understood that the various metrics such as 0.25 microns may have distinctly different dimensions in one business entity from a comparative business entity. Accordingly, such metrics, although quantitatively called out, may differ between a given two business entities. Other minimum features that may be accomplished in the future are applicable to the present invention. It is also discernible from the illustrations that the first electrodes have a first width, the second electrodes have a second width, and a given discrete, spaced-apart polymer structure in the array of discrete, spaced-apart polymer structures has an area that is greater than the product of the first width and the second width.

According to some embodiments of the present invention, at least one article quality is accomplished. Because of the present state of photolithographic minimum features, patterning to achieve a discrete, spaced-apart FEP structure may have a maximum feature that is smaller than the typical chain length of about one micron that is found within a domain wall of an FEP material. A lower voltage is required to cause the FEP structure to reorient due to the shorter chain length.

Figure 12:
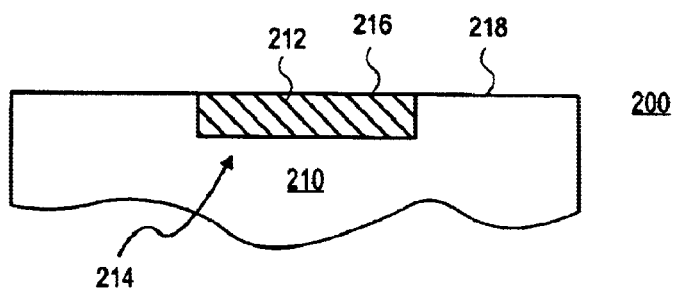
FIG. 12 is an elevational cross-section view of a semiconductor structure that illustrates one stage of fabrication of an embodiment of the present invention.

A damascene technique may also be used in an embodiment. FIG. 12 illustrates a damascene technique in which a memory device 200 during fabrication includes a substrate 210 with a first or lower electrode 212 disposed in the substrate 210. Processing may include formation of a recess 214, filling recess 214 with a first electrode layer (not illustrated), and carrying out a polish or etchback technique that forms first electrode 212 with an electrode upper surface 216 that is substantially coplanar with a substrate upper surface 218. Reduction of the vertical profile may be carried out by mechanical polishing, chemical-mechanical polishing (CMP), chemical etchback, and the like. Thereafter, processing of an FEP layer 220 may be carried out as depicted in FIG. 12.

Figure 13:
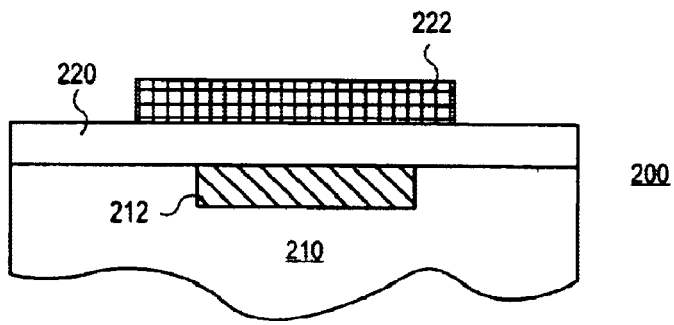
FIG. 13 is an elevational cross-section view of the semiconductor structure depicted in FIG. 12 after further processing.

FIG. 13 illustrates a mask 222 that has been patterned over FEP layer 220 in a manner that will assure electrical insulation of first electrode 212 within substrate 210.

Figure 14:
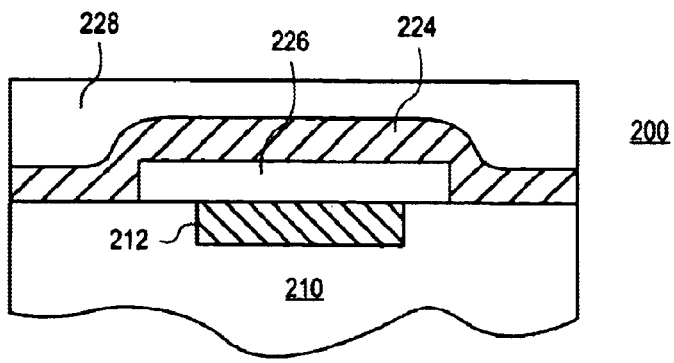
FIG. 14 is an elevational cross-section view of the semiconductor structure depicted in FIG. 13 after further processing.

FIG. 14 illustrates memory device 200 after further processing as set forth herein. After the formation of a segmented, elongated FEP structure (not depicted), a second or upper electrode 224 has been formed as set forth herein. In this embodiment, as processing geometries grow smaller, the formation of a damascene first electrode 212 in substrate 210 may assist in preventing photolithographic focusing problems by presenting a reduced topology than the embodiment depicted in FIG. 10. After further processing, second electrode 224 is used as a mask to form discrete, spaced-apart FEP structures 226. In this embodiment, it is also preferable to form a protective film 228 above an on the electrodes.

Figure 15:
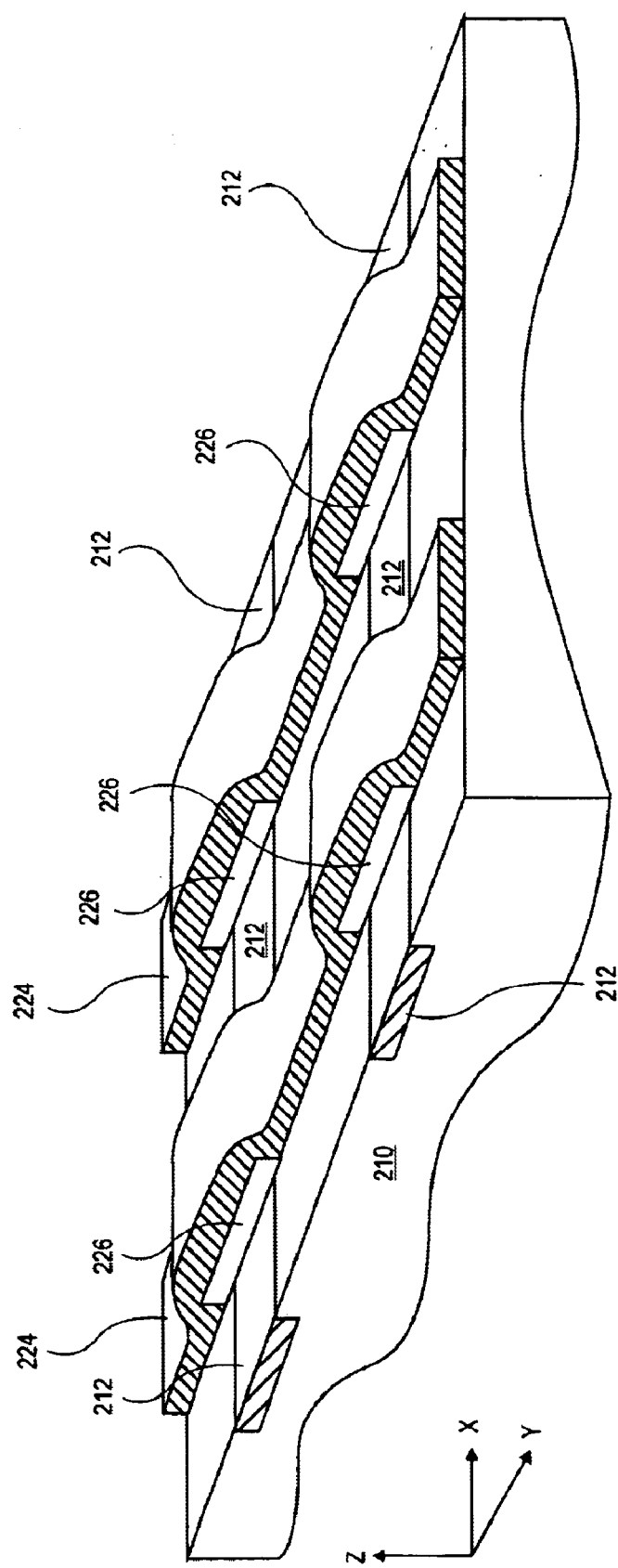
FIG. 15 is an elevational oblique view of the semiconductor structure depicted in FIG. 14, with one layer removed for illustrative purposes.

FIG. 15 is an elevational oblique view of memory device 200 with protective film 228, depicted in FIG. 14 removed for clarity. FIG. 15 depicts the damascene structure of first electrode 212 embedded within substrate 210 after a manner that will lower the vertical or Z-dimension profile of memory device 200. Accordingly, photolithographic depth-of-field limitations are not as restricted in this embodiment. FIG. 15 also depicts the presence of discrete, spaced-apart FEP structures 226 that serve both as a data storage structure according to the present invention, as also as an insulator that prevents shorting between first electrode 212 and second electrode 224.

Various polymers may be used to form the discrete, spaced-apart FEP structures. In one embodiment, discrete, spaced-apart FEP structures are made from a ferroelectric polymer selected from polyvinyl and polyethylene fluorides, copolymers thereof, and combinations thereof. In another embodiment, the FEP structures are made from a ferroelectric polymer selected from polyvinyl and polyethylene chlorides, copolymers thereof, and combinations thereof. In another embodiment, the FEP structures are made from a ferroelectric polymer selected from polyacrylonitriles, copolymers thereof, and combinations thereof. In another embodiment, the FEP structures are made from a ferroelectric polymer selected from polyamides, copolymers thereof, and combinations thereof. Other embodiments may include combinations of the above that cross different types such as polyfluorides and polyamides or polyfluorides and polyacrylonitriles.

In one embodiment, the FEP structures are made from a ferroelectric polymer selected from $(CH_2—CF_2)_n$, $(CHF—CF_2)_n$, $(CF_2—CF_2)_n$, α-, β-, γ-, and δ-phases thereof, preferably the β-phase, $(CH_2—CF_2)_n—(CHF—CF_2)_m$ copolymer, α-, β-, γ-, and δ-phases, preferably the β-phase of $(CH_2—CF_2)_n—(CHF—CF_2)_m$ copolymer, and combinations thereof. The copolymer of $(CH_2—CF_2)_n—(CHF—CF_2)_m$ may be referred to as P(VDF—TrFE) or poly vinylidene fluoride-triflouroethylene. In one particular embodiment, the FEP structures are made from a ferroelectric polymer selected from a β-phase copolymer of $(CH_2—CF_2)_n—(CHF—CF_2)_m$ wherein n and m equal 1, and wherein n is in a fraction range from about 0.6 to about 0.9, preferably from about 0.7 to about 0.8, and more preferably about 0.75.

A preferred vertical thickness of a discrete, spaced-apart FEP structure may be in a range from about 500 Å to about 2,000 Å or larger, subject only to the design rules of a specific application. Other thicknesses for a discrete, spaced-apart FEP structure may be in a range from about 1,000 Å to about 1,500 Å.

Most polymer systems will exhibit some degree of atacticity. Where an FEP copolymer is formed by the spin-on technique, the film will tend more away from isotacticity than for a monomer under similar deposition conditions. In one embodiment, the ordered amount of crystallinity (degree of isotacticity) in a discrete, spaced-apart FEP structure is in a range from about one-third to about two-thirds, preferably greater that about one-half. The ordered amount of the crystalline structure may be quantified by diagnostic techniques such as scanning electron microscopy, x-ray diffraction, and others.

Figure 16:
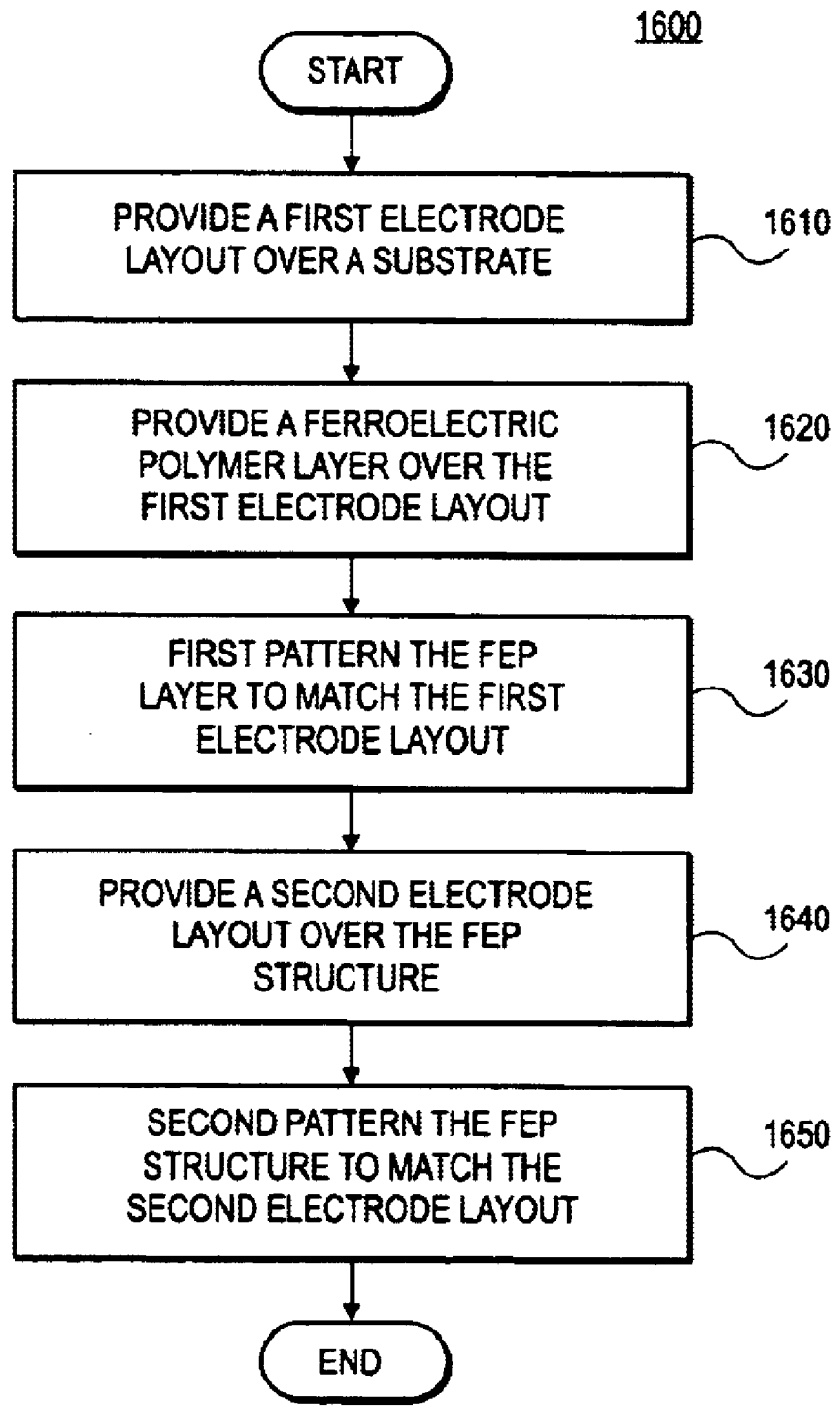
FIG. 16 is a flow chart that describes method embodiments.

FIG. 16 illustrates a process flow embodiment that describes fabrication of a memory device that comprises an array of discrete, spaced-apart FEP structures. First, the process 1600 begins by forming 1610 a first electrode layout on a substrate. The substrate may be silicon with logic and other structures such as embedded memory. The logic and/or embedded memory may include structures such as n-doped metal oxide silicon (n-MOS), p-doped MOS (p-MOS), complementary MOS (CMOS), bipolar CMOS (BiCMOS) and others. The substrate may also be a processor that includes row and column addressing communication at a periphery. As set forth herein, the substrate may also be an FR-type structure or a polyimide ILD structure.

Upon the substrate, the inventive embodiment(s) may be arranged with contact of first and second electrodes at the periphery. After forming 1610 of the first electrode layout, the process flow continues by providing 1620 an FEP layer over the first electrode layout. Thereafter, a first patterning 1630 of the FEP layer is carried out to achieve segmented, elongated FEP structures. A second electrode layout is provided 1640 over the segmented, elongated FEP structures. Finally, a second patterning 1650 of the FEP material is carried out to achieve discrete, spaced-apart FEP structures. Other processing is carried out such as forming a protective layer over the electrodes as set forth herein.

Figure 17:
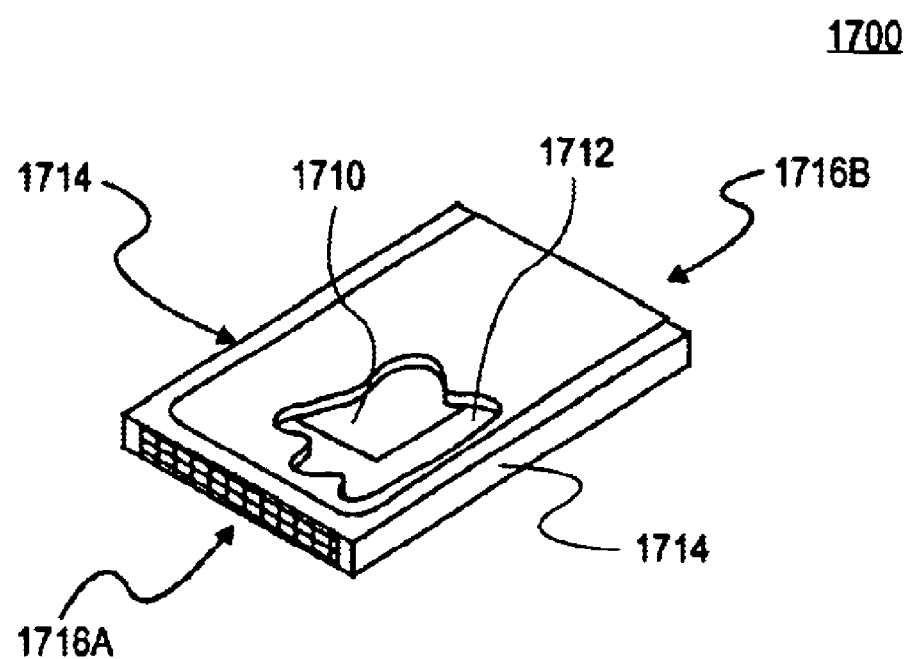
FIG. 17 is an elevational oblique view of a system embodiment of the present invention.

One embodiment of the present invention is a memory system. FIG. 17 illustrates an elevational oblique view of part of a memory system 1700 that is inserted into a host (not pictured) according to an embodiment of the present invention. The memory system 1700 besides the host (not pictured) may include a polymer memory device 1710 disposed upon a substrate 1712 that may be microprocessor silicon, inorganic ILD material such as silicon oxide, organic ILD material such as polyimide, or others. Alternatively, substrate 1712 may be a board such as a fiberglass-resin (FR) card or motherboard including a current type referred to as FR4.

In FIG. 17, the substrate 1712 is depicted as an FR board that may contain a chip set thereon. A physical interface 1714 for a host is also depicted in FIG. 17. In one embodiment, physical interface 1714 may be the lateral edges of a PCMCIA card as depicted in FIG. 17. In another embodiment the physical interface may be a dual in-line lead frame package that will disposed upon a motherboard, an expansion card, and application-specific integrated circuit (ASIC) board, or the like. A signal interface 1716A, 1716B is also depicted in FIG. 17. In this embodiment, signal interface 1716A may be a female socket bank such as on a PCMCIA card that connects the polymer memory device 1710 to a host. Signal interface 1716B is a jack for a plug-in device such as a telephone or networking cable or the like. In this embodiment, signal interface 1716B may be related to communications technology. Other embodiments of a signal interface 1716B may include optical interfaces including wave guides and spatial transmitter/receiver devices such as an infrared (IR) port for communicating with a handheld device. Other embodiments of a signal interface 1716B may include short-range radiant energy signals such as the technology commonly referred to as Bluetooth.

The data storage portion of the inventive memory system 1700 may include the polymer memory device 1710 that is disposed on the substrate 1712. As set forth herein, the polymer memory device 1710 may comprise a first electrode disposed on a substrate, an array of discrete, spaced FEP structures, and a second electrode as set forth herein. Other, more specific embodiments of the inventive memory system as set forth herein may be employed.

Various physical interfaces may be employed with the inventive memory system 1700, depending upon the appropriate host. The memory system 1700 may be employed with a physical interface that is configured to a host type selected from communications hosts such as a PCMCIA card interface, a personal data assistant (PDA) interface with or without wireless communication ability, and a hand-held host such as a cellular telephone. Another host type may be a mobile data storage interface that may include a compact flash card interface, a MEMORY STICK® interface made by Sony Corporation, a HIP ZIP® or PEERLESS® interface made by Iomega Corporation, a POCKET CONCERT® interface made by Intel Corporation, and others. Another host type may be a removable storage medium interface, a desktop personal computer expansion slot interface, and the like. In each instance, the appearance of the specific physical interface 1714 will vary to take on the requisite receptacle, etc. of the host. Similarly, the appearance of the specific signal interface 1716A, 1716B will vary to take on the requisite connector, etc. of the host.

For example, a PCMCIA card has a physical interface comprising at least the long edges of the card that frictionally and slidingly connect with the card bay. The signal interface for a PCMCIA card comprises at least the female multi-contact sockets at the back of the card, and the specific plug-in outlets at the front of the card.

Low operating voltages are preferred and achieved by embodiments of the present invention. According to an embodiment, switching voltage may be in the range from about 0.5 V to less than about 9 V. Nonvolatile memory such as flash may require charge pump technology to achieve a sufficient voltage to write to the floating gate. The present invention presents a low-voltage technology for nonvolatile memory that may obviate the need for charge pump technology and other higher-voltage memory technologies.

The switching speed under certain voltages for and FEP device may be mainly determined by the microstructure and geometry of the FEP structures. When there is sufficient nucleation of β phases, but domain-wall limited rather than nucleation limited under a reduced coercive field, and where the geometry of the FEP structure is efficiently defined by the cross-point geometry of the electrodes in the range of submicrons, the switching speed may be in the range of about one microsecond.

The following is an example of a method of making an embodiment of the present invention. The process technology relates to 0.25 micron processing. Reference may be made to FIGS. 1–9. To fabricate a polymer memory device 100, a substrate 110 is provided, comprising logic-bearing silicon for an inventive cross-point polymer memory device. Substrate 110 may include an ILD dielectric material such as silicon oxide or an organic ILD material such as a polyimide or an FR board. Over substrate 110, a conductive layer 112 is formed by CVD of aluminum or copper. A photoresist material is spun on exposed, and patterned to form first mask 114. Spin-on conditions include depositing the photoresist material as a fluid in a puddle prime onto substrate 12 for a period of from about 5 to 25 seconds and spinning substrate 12 and in a rotational range from about 300 rpm to about 6000 rpm and for a time range from about 5 seconds to about 20 seconds.

First mask 114 has a width of about 0.25 micron. Thereafter, an anisotropic etch is carried out that has an etch recipe selective to substrate 110 and first mask 114. First electrode 116 is the result. Under similar spin-on conditions, an FEP material is spun on and cured over first electrode 116 to form an FEP layer 118. Additional photoresist is spun on, exposed, and patterned to form second mask 126. Thereafter, an oxygen plasma etch is carried out according to known technique at about 23° C. and about one atmosphere. The oxygen plasma etch may also be referred to as a first patterning of an FEP structure. The etch effectively removes exposed FEP layer 118 and leaves segmented, elongated FEP structures 128.

A second electrically conductive layer is patterned into a series of second or upper electrodes 130. Finally, a second oxygen plasma etch is carried out under similar conditions to remove any exposed FEP material. After the second oxygen plasma etch, discrete, spaced-apart FEP structures 132 are left that have a polymer chain length that is shorter that what normally occurs in typical spin-on FEP processing. The second oxygen plasma etch may be referred to as a second patterning of the FEP structure 132. Other processing may occur such as the formation of a polyimide protective layer 134.

The discrete, spaced-apart FEP structures 132 have a thickness from about 500 Å to about 2,000 Å, preferably about 1,000 Å. The discrete, spaced-apart FEP structures 132 comprise a copolymer of $(CH_2-CF_2)_n-(CHF-CF_2)_m$ wherein n and m equal 1, and wherein n is about 0.75.

According to this example, the cross-point matrix polymer memory device operates in a range below about 9 V, and preferably in a range from about 0.5 V to about 5 V. This voltage may relate to both the destructive read method and the write method according to an embodiment.

In a second example, all of the processing conditions of the first example are carried out with the modification that reference may be made to FIGS. 12–15. Accordingly, first electrode 212 is a damascene structure in substrate 210.

It will be readily understood to those skilled in the art that various other changes in the details, material, and arrangements of the parts and method stages which have been described and illustrated in order to explain the nature of this invention may be made without departing from the principles and scope of the invention as expressed in the subjoined claims.

What is claimed is:

1. A polymer memory device comprising:
   a series of first electrodes;
   an array of discrete, spaced-apart polymer structures disposed over the series of first electrodes; and
   a series of second electrodes disposed over the discrete, spaced-apart polymer structures.

2. The polymer memory device according to claim 1, wherein the first electrodes have a first width, wherein the second electrodes have a second width, and wherein a given polymer structure in the array of discrete, spaced-apart polymer structures has an area that is greater than the product of the first width and the second width.

3. The polymer memory device according to claim 1, wherein the first and second electrodes have a width that is a minimum feature of a photolithography technology selected from 0.25 micron, 0.18 micron, 0.13 micron, and 0.11 micron.

4. The polymer memory device according to claim 1, further comprising:
   a protective film disposed above and on the electrodes.

5. The polymer memory device according to claim 1, further comprising:
   an organic protective film disposed above and on the electrodes.

6. The polymer memory device according to claim 1, wherein each electrode in the series of electrodes has four rectilinear surfaces in cross-section, and wherein each electrode in the series of first electrodes is contacted by the polymer structure on three of the four surfaces.

7. The polymer memory device according to claim 1, wherein the series of first electrodes comprises a damascene structure disposed in a substrate.

8. The polymer memory device according to claim 1, wherein the array of discrete, spaced-apart polymer structures further comprise a polymer selected from $(CH_2-CF_2)_n$, $(CHF-CF_2)_n$, $(CF_2-CF_2)_n$, $\alpha$-, $\beta$-, $\gamma$-, and $\delta$-phases thereof, $(CH_2-CF_2)_n-(CHF-CF_2)_m$ copolymer, $\alpha$-, $\beta$-, $\gamma$-, and $\delta$-phases thereof, and combinations thereof.

9. A process of forming a polymer memory structure comprising:
   first patterning a ferroelectric polymer structure to match a first electrode layout; and
   second patterning the ferroelectric polymer structure to match a second electrode layout.

10. The process according to claim 9, wherein first patterning further comprises:
    patterning the ferroelectric polymer structure over the first electrode layout under conditions that substantially cover the first electrode layout and that forms segmented, elongated ferroelectric polymer structures.

11. The process according to claim 10, wherein second patterning further comprises:
    patterning the segmented, elongated ferroelectric polymer structures by using the second electrode layout as an etch mask.

12. The process according to claim 9, before first patterning a ferroelectric polymer structure to match a first electrode layout, the process further comprising:
    providing a substrate; and
    forming the first electrode layout as a damascene structure in the substrate.

13. The process according to claim 12, after second patterning the ferroelectric polymer structure to match a second electrode layout, the process further comprising:
    forming an organic protective film above and on the first and second electrode layouts.

14. The process according to claim 9, before first patterning a ferroelectric polymer structure to match a first electrode layout, the process further comprising:
    providing a substrate;
    forming the first electrode layout upon an upper surface of the substrate.

15. The process according to claim 14, after second patterning a ferroelectric polymer structure to match a second electrode layout, the process further comprising:
    forming an organic protective film above and on the first and second electrode layouts.

16. A process of forming a memory device comprising:
    providing a ferroelectric polymer structure between an array of intersecting lower and upper electrodes; and
    removing ferroelectric polymer material that is laterally exposed between the array of electrodes.

17. The process according to claim 16, wherein providing a ferroelectric polymer structure between an array of intersecting lower and upper electrodes further comprises:
    providing a substrate;
    forming the lower electrode layout;
    forming the ferroelectric polymer structure over the lower electrode layout;
    first patterning the ferroelectric polymer structure to form segmented, elongated ferroelectric polymer structures; and
    forming the upper electrode layout.

18. The process according to claim 17, wherein removing ferroelectric polymer material that is laterally exposed between the array of electrodes further comprises:
    first patterning the ferroelectric polymer structure to form segmented, elongated ferroelectric polymer structures; and second patterning the ferroelectric polymer structure to form discrete, spaced-apart ferroelectric polymer structures.

19. The process according to claim 18, wherein second patterning further comprises:

patterning the segmented, elongated ferroelectric polymer structures by using the upper electrode layout as an etch mask.

20. The process according to claim 18, after second patterning, the process further comprising:

forming an organic protective film above and on electrode layouts.

21. The process according to claim 17, before first patterning, the process further comprising:

providing a substrate; and forming the lower electrode layout as a damascene structure in the substrate.

22. The process according to claim 17, before first patterning, the process further comprising:

providing a substrate; and forming the lower electrode layout upon an upper surface of the substrate.

23. The process according to claim 22, after second patterning, the process further comprising:

forming an organic protective film above and on electrode layouts.

24. A memory system comprising:

a substrate disposed on a physical interface for a host;

a memory article disposed on the substrate, the memory article comprising:

a series of first electrodes;

an array of discrete, spaced-apart polymer structures disposed over the series of first electrodes; and a series of second electrodes disposed over the discrete, spaced-apart polymer structures; and a signal interface for communication from the memory article to the host; and a host.

25. The memory system according to claim 24, wherein the physical interface is configured to a host interface that is selected from a PCMCIA card interface, a compact flash card interface, a memory stick-type card interface, a desktop personal computer expansion slot interface, and a removable medium interface.

26. The memory system according to claim 24, wherein the first and second electrodes have a width that is a minimum feature of a photolithography technology selected from 0.25 micron, 0.18 micron, 0.13 micron, and 0.11 micron.

27. The memory system according to claim 24, further comprising:

a protective film disposed above and on the electrodes.

28. The memory system according to claim 24, wherein the series of first electrodes is contacted by the polymer structure on three of four surfaces.

29. The memory system according to claim 24, wherein the series of first electrodes comprises a damascene structure disposed in a substrate.

* * * * *